US007288468B2

(12) United States Patent
Jang et al.

(10) Patent No.: US 7,288,468 B2
(45) Date of Patent: Oct. 30, 2007

(54) LUMINESCENT EFFICIENCY OF SEMICONDUCTOR NANOCRYSTALS BY SURFACE TREATMENT

(75) Inventors: Eun Joo Jang, Suwon-Si (KR); Shin Ae Jun, Seongnam-Si (KR); Hyang Sook Seong, Suwon-Si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 88 days.

(21) Appl. No.: 10/785,067

(22) Filed: Feb. 25, 2004

(65) Prior Publication Data
US 2005/0051769 A1 Mar. 10, 2005

(30) Foreign Application Priority Data
Sep. 9, 2003 (KR) .................. 10-2003-0063229

(51) Int. Cl.
*H01L 21/00* (2006.01)
*H01L 29/08* (2006.01)

(52) U.S. Cl. .............. 438/500; 438/102; 438/962; 257/42; 257/614; 257/E21.002

(58) Field of Classification Search ........... 438/102, 438/500, 763, 962; 257/42, 614
See application file for complete search history.

(56) References Cited

U.S. PATENT DOCUMENTS 6,207,229 B1  3/2001  Bawendi et al.
6,322,901 B1  11/2001  Bawendi et al.
6,576,291 B2  6/2003  Bawendi et al.
6,853,669 B2*  2/2005  Simpson et al. .............. 372/92
6,855,204 B2*  2/2005  Kauzlarich et al. ........... 117/89
6,878,184 B1*  4/2005  Rockenberger et al. ....... 75/343
6,906,339 B2*  6/2005  Dutta .......................... 257/40

OTHER PUBLICATIONS

American Chemical Society, Murray et al, vol. 115, No. 19, 1993, pp. 8706-8715.
American Chemical Society, Talapin et al, vol. 1, No. 4, 2001, pp. 207-211.
Journal of Materials Chemistry, Chunggaze et al, vol. 9, pp. 2433-2437.
JACS Articles, Zhong et al, vol. 125, No. 28, 2003, pp. 8589-8594.

* cited by examiner

*Primary Examiner*—Zandra V. Smith
*Assistant Examiner*—Christy L Novacek
(74) *Attorney, Agent, or Firm*—Harness, Dickey & Pierce, P.L.C.

(57) ABSTRACT

A method for improving the luminescent efficiency of semiconductor nanocrystals by surface treatment with a reducing agent to produce an improvement in luminescent efficiency and quantum efficiency without creating changes in the luminescent characteristics of the nanocrystals such as luminescence wavelengths and the distribution thereof.

18 Claims, 3 Drawing Sheets

LUMINESCENT EFFICIENCY OF SEMICONDUCTOR NANOCRYSTALS BY SURFACE TREATMENT

BACKGROUND OF THE INVENTION

This non-provisional application claims priority under 35 U.S.C. § 119(a) on Korean Patent Application No. 2003-63229 filed on Sep. 9, 2003, which is herein incorporated by reference.

1. Field of the Invention

The present invention relates to an improvement in the luminescent efficiency in semiconductor nanocrystals by surface treatment, and more particularly to a method for improving the luminescent efficiency of semiconductor nanocrystals, prepared by wet chemistry method, without changing the luminescent characteristics of the nanocrystals such as luminescence wavelengths and the distribution thereof.

2. Description of the Related Art

When semiconductor compound material is manufactured into nano-sized crystals (nanocrystals), quantum confinement effects are exhibited in the range shorter than the bulk exciton Bohr radius of the compound semiconductor material. Due to the quantum confinement effects, the characteristic energies corresponding to the respective band gaps of the semiconductor materials are changed. When a semiconductor compound material capable of emitting visible light is manufactured into nanocrystals, the band gap energies of the semiconductor nanocrystal compounds begin to increase and consequently blue-shift, whereby it is observed that the luminescent region is shifted toward the blue region as the nanocrystal size decreases below a particular size. Since the control over the characteristics, structure, shape and size of the semiconductor nanocrystals enable a control of the corresponding band gaps, energy levels over a very broad range can be obtained.

In recent years, there have been many attempts to grow nanocrystals in varied sizes by a wet chemistry method wherein a precursor material is deposited with a surfactant in a hot coordinating organic solvent. According to the wet chemistry method, as the nanocrystals are grown, the organic solvent is naturally coordinated to the surface of the nanocrystals and acts as a dispersant. Accordingly, the organic solvent allows the initial nucleus to grow to the level of nano-sizes. In addition, the wet chemistry method has the advantage in that the size of nanocrystals can be controlled by changing the concentration of the precursors, the kind of organic solvents, the synthesis temperature and time, and the like. However, the size of the nanocrystals to be synthesized is very small, and the surface area relative to the volume of the nanocrystal is increased, causing defects on the surface. Since these defects act as energy traps between energy band gaps, they degrade the luminescent efficiency of the nanocrystal. Moreover, the smaller the nanocrystals, the more serious the problem.

Methods reported heretofore for improving the luminescent efficiency of nanocrystals are largely divided into the following two processes.

The first process is a surface passivation process wherein a stable organic or inorganic material is coated on the surface of nanocrystals to form a protective film thereon. The luminescent efficiency of the nanocrystals varies depending on the kind of organic dispersant surrounding the surface of the nanocrystals. In this connection, it was reported that when allylamine or dodecylamine had been substituted for trioctyl phosphonic acid on the surface of CdSe nanocrystals, the nanocrystals exhibit 40~50% -improvement in luminescent efficiency (Nano letters, 2001, 1, 207-211). Based on the fact that inorganic protective films exhibit excellent stability and distinct effects compared to organic protective films, a great deal of research on the inorganic protective films has been conducted. Nanocrystals generally have a structure consisting of a core portion as substantial nanocrystals and a shell portion as an inorganic protective film. Core-shell structured nanocrystals exhibiting improved luminescent efficiency and the method for preparing the nanocrystals are disclosed in U.S. Pat. Nos. 6,322,901 and 6,207,229. The core-shell structured nanocrystal was reported to exhibit improved luminescent efficiency by 30~50%. However, since the preparation method involves a troublesome coating step and since the luminescence wavelengths and size distribution of the nanocrystals may be varied during coating, it has the drawback of broadening the luminescence wavelength distribution. In addition, due to the lattice mismatch between the core and shell portions and interface strain caused by the thickening shell, the luminescent efficiency of the nanocrystals may be degraded. Furthermore, the coating step is difficult to carry out and the reproducibility is poor. Moreover, the characteristics of materials constituting the core and shell portions limit the selection of the materials.

The second process is a synthesis of novel nanocrystals. The present inventor has developed nanocrystals with improved luminescent efficiency, presumably in alloy form, which can be synthesized in a simple way, and filed a patent application (Korean Patent Appln. No. 2003-0049547). The nanocrystals are prepared by mixing at least two precursors belonging to the same group and a precursor belonging to a different group, and adding the mixture to an organic solvent. The reaction between the precursors leads to the synthesis of three-component nanocrystals. The nanocrystals thus synthesized exhibit an improvement in luminescent efficiency and are prepared in a simple and easy way in comparison with the nanocrystals having a core-shell structure as discussed above. Similarly, there is a report that three-component nanocrystals can be prepared in the form of a homogeneous alloy or can have a gradient composition, depending on the mixing ratio of the precursors. In addition, there is another report wherein nanocrystals in alloy form and having improved luminescent efficiency were synthesized by annealing core-shell structured nanocrystals at high temperature (J. Am. Chem. Soc., 2003, 125, 8589-8594).

Although the nanocrystals discussed above exhibit an improvement in luminescent efficiency, there have been few reports regarding the luminescent efficiency of nanocrystals which can emit light, in particular, in the blue region (having higher energies). This fact suggests that the problems caused by energy traps formed on the surface of small size crystals still remain unsolved.

SUMMARY OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Therefore, the present invention has been made in view of the above problems, and thus one of the features of the present invention is to provide a method for improving the luminescent efficiency of nanocrystals which emit light over the entire luminescence spectral range, in particular, the blue region, without changes in the luminescent properties of the nanocrystals after surface treatment.

Another feature of the present invention is to provide compound semiconductor nanocrystals which exhibit improved luminescent efficiency as a result of surface treatment Yet another feature of the present invention is to provide an organic electroluminescent device containing the nanocrystals.

In accordance with a feature of the present invention, there is provided a method for improving the luminescent efficiency of semiconductor nanocrystals synthesized by a wet chemistry method, the method including the step of surface-treating the semiconductor nanocrystal with a reducing agent, after synthesis.

In accordance with another feature of the present invention, there is provided a semiconductor nanocrystal which has been surface-treated with a reducing agent In accordance with yet another feature of the present invention, there is provided an organic electroluminescent device containing a plurality of organic and inorganic layers including a luminescent layer, wherein the luminescent layer comprises a semiconductor nanocrystal surface-treated with a reducing agent.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAILED DESCRIPTION OF THE INVENTION

Figure 1:
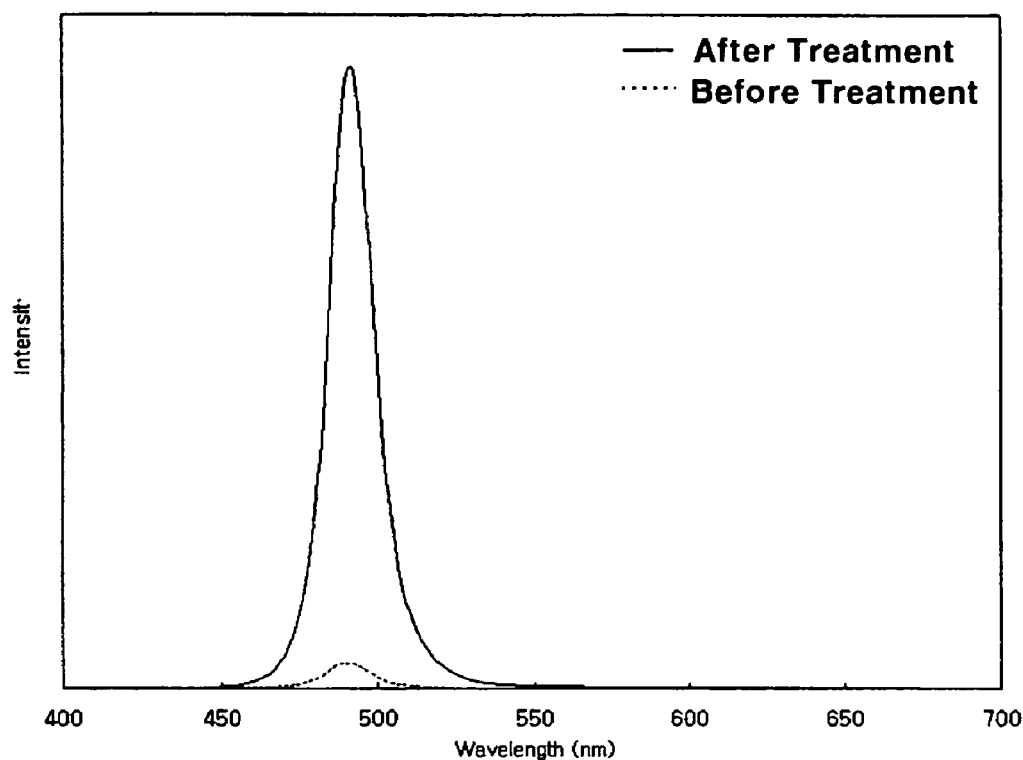
FIG. 1 is photoluminescence spectra of CdS nanocrystals prepared in Example 1 of the present application, before and after surface treatment.

Hereinafter, the present invention will be explained in more detail.

In the present invention, the preparation of semiconductor nanocrystals is performed by the wet chemistry method commonly known in the art, and is described in detail below. However, the present invention is not limited to the procedure described below.

In order to prepare semiconductor nanocrystals by the wet chemistry method, the selection of the dispersing solvent in which the nanocrystals are dispersed is important. The solvent used in the present invention should be able to be coordinated to the surface of the compound semiconductor nanocrystals, and sufficiently bulky to the extent that it can control the growth rate of the semiconductor nanocrystals. In addition, the solvent should be stable at the crystal growth temperature, and be able to disperse the nanocrystals in a state where the solvent is coordinated to the surface of the nanocrystals. Examples of the solvent include, but are not limited to, alkyl phosphines, alkyl phosphine oxides, alkyl amines, and the like. Preferably, phosphine, phosphine oxide, or a bulky alkyl amine having a high boiling point in which the alkyl group has about 8~16 carbon atoms and the nitrogen atom is coordinated to the surface of the nanocrystals, is used alone or in combination.

These solvents are relatively stable in air, but may be oxidized at high temperatures. Accordingly, the solvent is maintained under an inert atmosphere, e.g., nitrogen or argon during the synthesis process. If necessary, the solvent can be maintained under pressure. The semiconductor nanocrystal may have a chemically reduced and/or oxidized surface.

If necessary, a dispersant is further added and coordinated to the nanocrystals in order to effect a good dispersing of the nanocrystals in the solvent.

Specific examples of the dispersant include, but are not limited to, $C_{2~18}$ alkylcarboxylic acids, $C_{2~18}$ alkenylcarboxylic acids, $C_{2~18}$ alkylsulfonic acids, $C_{2~18}$ alkenylsulfonic acids, $C_{2~18}$ phosphonic acids, $C_{2~18}$ alkylamines, $C_{2~18}$ alkenylamines and the like. More preferably, oleic acid, stearic acid, palmitic acid, hexylphosphonic acid, n-octylphosphonic acid, tetradecylphosphonic acid, octadecylphosphonic acid, n-octyl amine, hexadecyl amine, and the like can be used.

The reaction is carried out in the solvent under appropriate reaction conditions, e.g., atmosphere and temperature. At this time, it is preferred that the temperature distribution in the reaction system is narrow. The reaction temperature is dependent on the growth rate of the nanocrystals, and may vary according to the kind of materials to be synthesized. The reaction temperature is commonly in the range of 25~500° C., and preferably 25~350° C. When the reaction temperature is maintained constant, semiconductor precursor materials are fed to the reaction system. At this time, it is important to control the feeding rate so that all the precursor materials can be simultaneously fed to the reaction system. With respect to the semiconductor precursor, the method of adding a metal precursor and a chalcogenide precursor separately and reacting them is generally known in the art [J. Am. Chem. Soc., 115, 8706-8715 (1993)]. In addition, there is known a method of adding a one-component precursor and pyrolyzing it [J. Mater. Chem., 9, 2433-2437 (1999)]. In this case, a solvent which can readily disperse the precursor is used. The solvent should have a low viscosity sufficient to control the feeding rate of the precursor solution and be stable in the reaction system. As the solvent, pyridine, alkyl amines, alkyl phosphines and the like are preferred. A stirrer for rapidly dispersing the precursor in the reaction solution after adding the precursor, and a vent for exhausting gases generated during the reaction are needed as part of the reactor. After the mixture is maintained for a predetermined time so that quantum dots are grown in the form of a crystal, the reaction is finished. Alternatively, in the case of quantum dots in a core-shell structure, an inorganic precursor is further added to coat the surface of the core. When a precursor for coating the core is injected, the precursor is slowly diffused within a predetermined concentration range so that it can be deposited onto the core surface without the formation of additional cores.

The reaction temperature is then suddenly decreased to quench the crystal growth of the nanocrystals. For this purpose, an organic solvent having a relatively low boiling point is further added. The heat of the reaction solution is absorbed through vaporization of the solvent. The growth of the crystals can be quenched. Accordingly, the control over the amount of the solvent added enables the reaction temperature to be lowered below a predetermined temperature, thus quenching the growth of the crystals. The nanocrystals thus prepared are dispersed in the solvent in a colloidal state. They can be separated from the solvent by centrigation.

The semiconductor nanocrystals may have various shapes, e.g., spheres, rods, tripods, tetrapods, cubes, boxes, stars, etc., depending on the reaction conditions, and the shape and the crystal surface of the nanocrystals can be determined by high-resolution transmission electron microscopy (HRTEM).

In the present invention, the compound semiconductor nanocrystals prepared by the wet chemistry method are treated with a reducing agent The reduction improves the luminescent efficiency of the semiconductor nanocrystals.

The method according to the present invention can be applied to all semiconductor nanocrystals independent of their kind. Concretely, semiconductor nanocrystals made of CdS, CdSe, CdTe, ZnS, ZnSe, ZnTe, HgS, HgSe, HgTe, GaN, GaP, GaAs, InP, InAs or a mixture thereof can be used. On the other hand, the method of the present invention can be applied, without limitation, to core-shell, gradient and alloy type nanocrystals. The luminescence spectral range of the semiconductor nanocrystals is typically 300~1,300 nm.

As the reducing agent used in the present invention, all types of salts capable of generating hydride ions such as sodium borohydride, lithium borohydride, lithium aluminumhydride and the like, organic reducing agents such as hydrazines, all gases capable of forming reducing atmospheres such as hydrogen, hydrogen sulfide, ammonia and the like, and solutions in which the gases are dissolved, etc., can be used.

The weight ratio of the nanocrystals to the reducing agent added for the reduction is preferably in the range of 1:10~10:1. When the weight ratio is out of this range, the oxidization-reduction reaction by the reducing agent is insufficient for treating the surface of the nanocrystals or the surface of the nanocrystals is contaminated by the reducing agent.

Examples of the solvent usable for the reduction include, but are not limited to, aromatic solvents such as toluene, chlorobenzene, etc., normal alkane solvents such as hexane, octane, etc., non-polar solvent such as methylene chloride, chloroform, etc., alcohols such as ethanol, propanol, butanol, etc., polar solvents such as dimethyl formamide, tetrahydrofuran, etc.

The reduction is carried out at a temperature of 0~100° C. and preferably 10~50° C. When the reduction temperature exceeds 100° C., agglomeration of the nanocrystals takes place. When the reduction temperature is lower than 0° C., the reaction rate is too low. The treatment time required for the treatment effects to be exhibited varies depending on the kind of the nanocrystals, e.g., 1 second to 2 days. If the treatment time is not within this range, the reaction may be insufficient or precipitation may take place.

In accordance with the method of the present invention, the luminescent efficiency of the semiconductor nanocrystals is improved preferably by greater than 30%, and more preferably by 60%.

The nanocrystals surface-treated by the method of the present invention can be utilized in various applications such as displays, sensors, energy fields, and are particularly useful to form luminescent layers of electroluminescent devices. Wet processes such as printing, coating, ink-jetting and the like can be employed to form luminescent layers using the semiconductor nanocrystals. The luminescent layers thus formed preferably have a thickness of 50~100 nm.

The electroluminescent device may have a general structure such as anode/luminescent layer/cathode, anode/buffer layer/luminescent layer/cathode, anode/hole transport layer/luminescent layer/cathode, anode/buffer layer/hole transport layer/luminescent layer/cathode, anode/buffer layer/hole transport layer/luminescent layer/electron transport layer/cathode, anode/buffer layer/hole transport layer/luminescent layer/hole blocking layer/cathode structures, etc., but is not particularly limited to these structures.

As materials constituting the buffer layer, compounds commonly used in the art for this purpose can be used. Preferred examples include, but are not particularly limited to, copper phthalocyanine, polythiophene, polyaniline, polyacetylene, polypyrrole, polyphenylene vinylene and derivatives thereof.

As materials constituting the whole transport layer, compounds commonly used in the art for this purpose can be used and preferably polytriphenylamine is used, but the present invention is not particularly limited to this compound.

As materials constituting the electron transport layer, compounds commonly used in the art for this purpose can be used and preferably polyoxadiazole is used, but the present invention is not particularly limited to this compound.

As materials constituting the hole blocking layer, compounds commonly used in the art for this purpose can be used. Preferred examples include, but are not particularly limited to, LiF, $BaF_2$, $MgF_2$ and the like.

The organic electroluminescent device of the present invention comprising a plurality of organic and inorganic layers does not require particular fabrication apparatus and methods. The organic electroluminescent device can be fabricated in accordance with conventional fabrication methods using common luminescent materials.

Hereinafter, the present invention will be described in more detail with reference to the following examples. However, these examples are given for the purpose of illustration and are not to be construed as limiting the scope of the invention.

EXAMPLE 1

Synthesis of CdS Nanocrystal's and Surface Treatment 16 g of trioctyl amine (hereinafter, referred to as 'TOA'), 1.9 g of oleic acid and 1.6 mmol of cadmium oxide are charged simultaneously into a 125 ml flask equipped with a reflux condenser. The mixture is heated to 300° C. with stirring. Separately, a sulfur (S) powder is dissolved in trioctyl phpsphine (hereinafter, referred to as 'TOP') to form an S-TOP complex solution in a sulfur concentration of about 0.1M. 1.0 ml of the S-TOP solution is rapidly fed to the previous mixture, and then reacted for 2 minutes with stirring. Immediately after the reaction is completed, the reaction mixture is cooled to room temperature. Ethanol as a non-solvent is added to the reaction mixture, and the resulting mixture is then centrifuged. The precipitates are separated by decanting the solution and dispersed in 8 ml of toluene to obtain a solution of CdS nanocrystals in toluene. 1 ml of the CdS solution is sampled and about 0.02 g of $NaBH_4$ is added thereto. The resulting mixture is stirred at room temperature for about 30 minutes to reduce the CdS nanocrystals.

Figure 2:
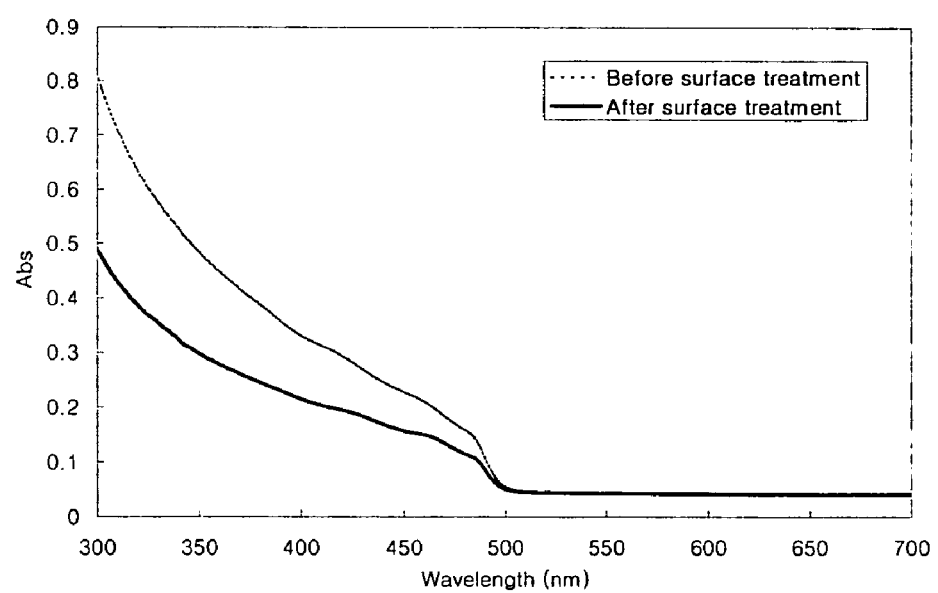
FIG. 2 is UV absorption spectra of CdS nanocrystals prepared in Example 1 of the present application, before and after surface treatment.
Figure 3:
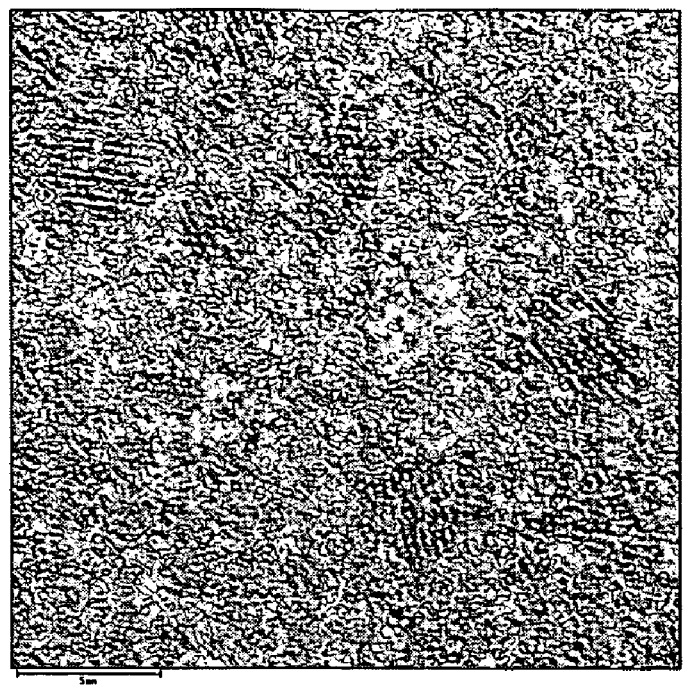
FIG. 3 is a high-resolution transmission electron microscopy (HRTEM) image of CdS nanocrystals prepared in Example 1 of the present application.
Figure 4:
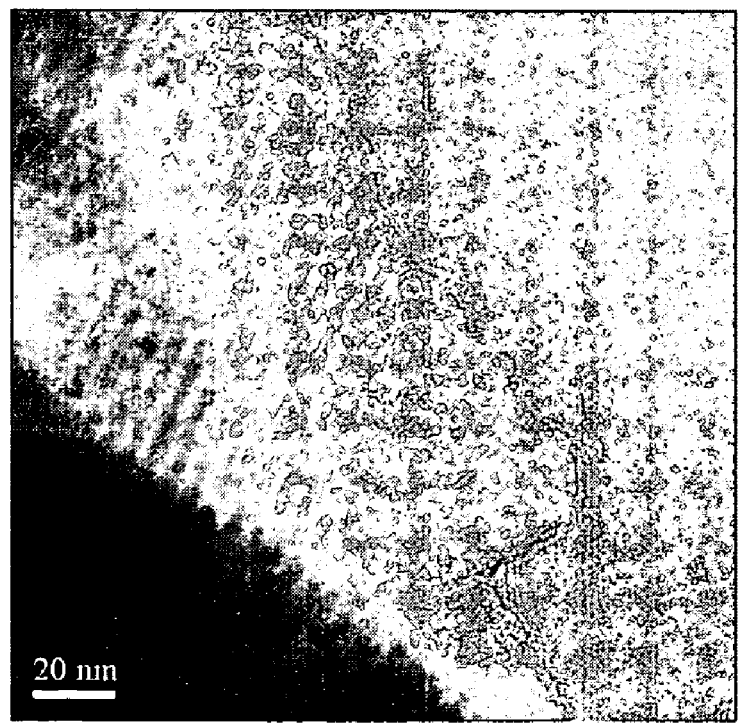
FIG. 4 is a transmission electron microscopy image of CdS nanocrystals prepared in Example 1 of the present application.

Photoluminescence spectra and UV absorption spectra of the CdS nanocrystals before and after surface treatment are shown in FIGS. 1 and 2, respectively. As shown in FIG. 1, luminescence peaks are observed at 490 nm, and had an FWHM (full with at half maximum) of approximately 25 nm. In addition, it is observed that the surface treatment did not cause any change in the luminescence wavelengths and a distribution thereof in the nanocrystals, but increased the intensity of the peaks. The luminescent efficiency is increased from 10% to 85% after the treatment. As shown in FIG. 2, the surface treatment has little or no influence on the UV absorption, and the two spectra showed similar profiles to each other. FIG. 3 is a high-resolution transmission electron microscopy (HR-TEM, scale bar=5 mm) image of the CdS nanocrystals after surface treatment with a reducing agent. The HR-TEM confirmed that the CdS nanocrystals have a uniform crystalline structure. FIG. 4 is a transmission electron microscopy (TEM, scale bar=20 mm) image of the dried CdS nanocrystal powder after surface treatment with a reducing agent The TEM image confirmed that the nanocrystals have uniform size distribution and thus arranged in a hexagonal packing structure.

EXAMPLE 2

Synthesis of CdTe Nanocrystals and Surface Treatment 16 g of TOA, 0.5 g of oleic acid and 0.2 mmol of cadmium acetate are charged simultaneously into a 125 ml flask equipped with a reflux condenser. The mixture is heated to 180° C. with stirring. Separately, a Te powder is dissolved in TOP to form a Te-TOP complex solution in a Te concentration of about 0.2M. 0.5 ml of the Te-TOP solution is rapidly fed to the previous mixture, and then reacted for 30 seconds with stirring. Immediately after the reaction is completed, the reaction mixture is cooled to room temperature. Ethanol as a non-solvent is added to the reaction mixture, and the resulting mixture is then centrifuged. The precipitates are separated by decanting the solution and dispersing them in 5 ml of toluene to obtain a solution of CdTe nanocrystals in toluene. 1 ml of the CdTe solution is sampled and about 0.02 g of $NaBH_4$ is added thereto. The resulting mixture is stirred at room temperature for about 10 minutes to reduce the CdTe nanocrystals. Photoluminescence spectra of the CdTe nanocrystals are taken before and after the surface treatment. The photoluminescence spectra confirmed that luminescence peaks are observed at 622 nm, and have an FWHM of 60 nm. In addition, it is observed that the luminescent efficiency is increased about 5 times after the surface treatment.

EXAMPLE 3

Synthesis of CdSeS Nanocrystals and Surface Treatment 16 g of TOA, 0.5 g of oleic acid and 0.4 mmol of cadmium oxide are charged simultaneously into a 125 ml flask equipped with a reflux condenser. The mixture is heated to 300° C. with stirring. Separately, a Se powder is dissolved in TOP to form a Se-TOP complex solution in a Se concentration of about 0.25M, and a S powder is then dissolved in TOP to form an S-TOP complex solution in a S concentration of about 1.0M. 0.9 ml of the S-TOP solution and 0.1 ml of the Se-TOP solution are rapidly fed to the previous mixture, and then reacted for 4 minutes with stirring. Immediately after the reaction is completed, the reaction mixture is cooled to room temperature. Ethanol as a non-solvent is added to the reaction mixture, and the resulting mixture is then centrifuged. The precipitates are separated by decanting the solution and dispersed in 10 ml of toluene to obtain a solution of CdSeS nanocrystals in toluene. 1 ml of the CdSeS solution is sampled and about 0.02 g of $NaBH_4$ was added thereto. The resulting mixture is stirred at room temperature for about 30 minutes to reduce the CdSeS nanocrystals. Photoluminescence spectra of the CdSeS nanocrystals are taken before and after the surface treatment. The photoluminescence spectra confirm that luminescence peaks are observed at 552 nm, and have an FWHM of approximately 40 nm. In addition, it is observed that the luminescent efficiency is increased about 5 times after the surface treatment.

EXAMPLE 4

Synthesis of CdSe Nanocrystals and Surface Treatment 16 g of TOA, 0.5 g of oleic acid and 0.4 mmol of cadmium oxide are charged simultaneously into a 125 ml flask equipped with a reflux condenser. The mixture is heated to 300° C. with stirring. Separately, a Se powder is dissolved in TOP to form a Se-TOP complex solution in a Se concentration of about 1M. 1 ml of the Se-TOP solution is rapidly fed to the previous mixture, and then reacted for 1 minute with stirring. Immediately after the reaction is completed, the reaction mixture is cooled to room temperature. Ethanol as a non-solvent is added to the reaction mixture, and the resulting mixture is then centrifuged. The precipitates are separated by decanting the solution and dispersed in 10 ml of toluene to obtain a solution of CdSe nanocrystals in toluene. 1 ml of the CdSe solution is sampled and about 0.02 g of $NaBH_4$ is added thereto. The resulting mixture is stirred at room temperature for about 30 minutes. Photoluminescence spectra of the CdSe nanocrystals are taken before and after the surface treatment. The photoluminescence spectra confirmed that luminescence peaks are observed at 520 nm, and have an FWHM of approximately 35 nm. In addition, it is observed that the luminescent efficiency is increased about 7 times after the surface treatment.

EXAMPLE 5

Figure 5:
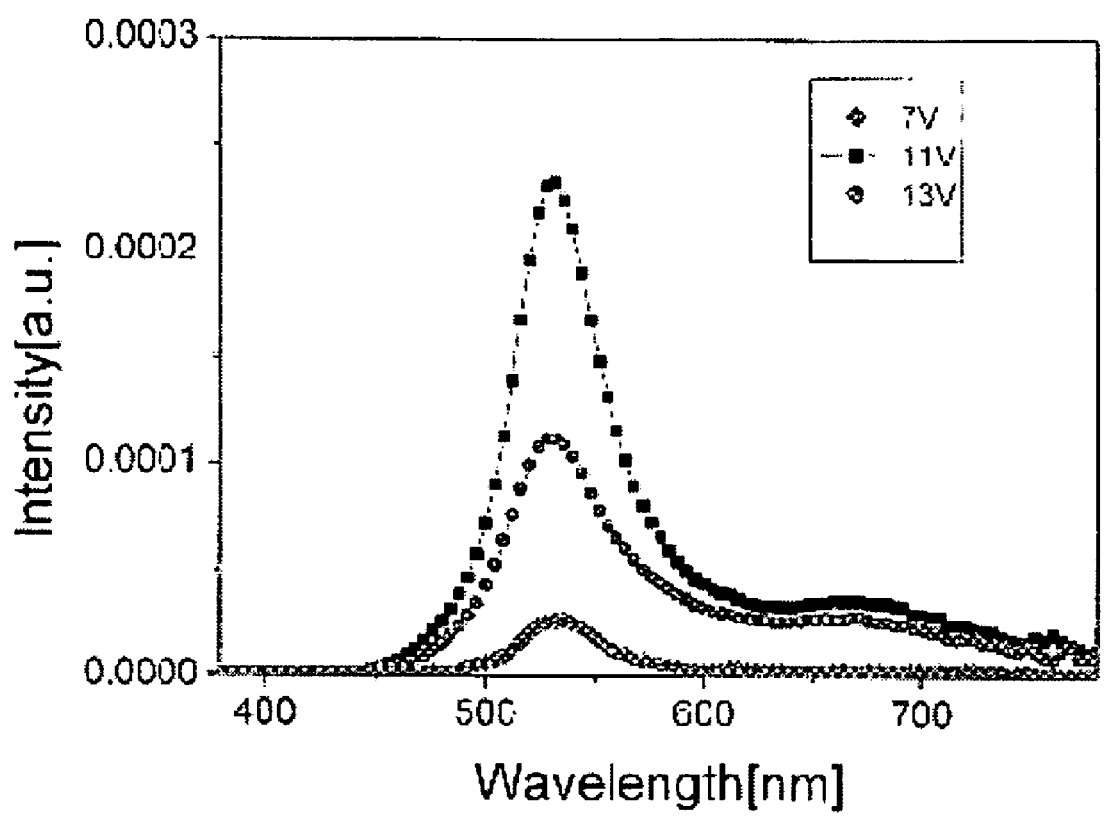
FIG. 5 a luminescence spectrum of an organic electroluminescent device fabricated in Example 5 of the present application.

Fabrication of Electroluminescent Device Using Surface-Treated CdSe Nanocrystals PEDOT (poly-3,4-ethylenedioxythiophene) as the entire transport layer is spin-coated onto a patterned ITO substrate to a thickness of 50 nm, and then baked at 110° C. for 10 minutes. On the resulting structure, a solution of 1% by weight of surface-treated CdSe nanocrystals in chlorobenzene is spin-coated and dried to form a luminescent layer having a thickness of 10 nm. $Alq_3$ (tris(8-hydroxyquinoline) aluminum) is deposited onto the luminescent layer to form an electron transport layer having a thickness of about 40 nm. LiF and aluminum are sequentially deposited onto the electron transport layer to thickness of 1 nm and 200 nm, respectively, to fabricate an electroluminescent device. The luminescence spectrum of the organic electroluminescent device thus fabricated is shown in FIG. 5. It is observed that luminescence peaks are observed around 520 nm, with an FWHM of approximately 40 nm. In addition, the brightness of the device is 10 $Cd/m^2$ and the efficiency of the device is about 0.1%.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for improving the luminescent efficiency of semiconductor nanocrystals which comprises surface-treating the semiconductor nanocrystals with a reducing or oxidizing agent, wherein the nanocrystals are coordinated by an organic dispersant.

2. The method of claim 1, wherein the semiconductor nanocrystals are synthesized by a wet chemistry method.

3. The method according to claim 1, wherein the semiconductor nanocrystals are core-shell, alloy or gradient structures made of at least one material selected from the group consisting of CdS, CdSe, CdTe, ZnS, ZnSe, ZnTe, HgS, HgSe, HgTe, GaN, GaP, GaAs, InP and InAs.

4. The method according to claim 1, wherein the reducing agent is a hydride ion-generating salt, an organic reducing agent, a reducing gas or solution containing the gas.

5. The method according to claim 4, wherein the reducing agent is selected from a group consisting of sodium borohydride, lithium borohydride, lithium aluminum hydride, hydrazine, hydrogen gas, hydrogen sulfide or ammonia.

6. The method according to claim 1, further comprising dispersing the nanocrystals in a solvent having an affinity with the dispersant.

7. The method according to claim 1, wherein the dispersant is at least one compound selected from the group consisting of $C_{2-18}$ alkylcarboxylic acids, $C_{2-18}$ alkenylcarboxylic acids, $C_{2-18}$ alkylsulfonic acids, $C_{2-18}$ alkenylsulfonic acids, $C_{2-18}$ phosphonic acids, $C_{2-18}$ alkylamines, $C_{2-18}$ alkenylamines and the salts thereof.

8. The method according to claim 7, wherein the dispersant is at least one compound selected from the group consisting of oleic acid, stearic acid, palmitic acid, hexylphosphonic acid, n-octylphosphonic acid, tetradecylphosphonic acid, octadecylphosphonic acid, n-octyl amine and hexadecyl amine.

9. The method according to claim 1, wherein the nanocrystals and the reducing agent are mixed in a weight ratio of 1:10-10:1.

10. The method according to claim 1, wherein the surface treatment of the nanocrystals is carried out in the range of 0-100° C.

11. The method according to claim 1, wherein the surface treatment of the nanocrystals is carried out for 1 second to 2 days.

12. The method according to claim 1, wherein the nanocrystals have a shape or mixed shape of a sphere, a rod, a tripod, a tetrapod, a cube, a box or a star.

13. The method according to claim 1, wherein the nanocrystals have sizes of 1-50 mm.

14. A semiconductor nanocrystal prepared by the method of claim 1.

15. An organic electroluminescent device comprising a plurality of organic and inorganic layers including a luminescent layer, wherein the luminescent layer comprises the semiconductor nanocrystals of claim 14.

16. A semiconductor nanocrystal having a chemically reduced or oxidized surface, wherein the semiconductor nanocrystal is coordinated by an organic dispersant.

17. The semiconductor nanocrystal according to claim 16, wherein the organic dispersant is at least one compound selected from the group consisting of $C_{2-18}$ alkylcarboxylic acids, $C_{2-18}$ alkenylcarboxylic acids, $C_{2-18}$ phosphonic acids, $C_{2-18}$ alkylamines, $C_{2-18}$ alkenylamines and the salts thereof.

18. The semiconductor nanocrystal according to claim 17, wherein the organic dispersant is at least one compound selected from the group consisting of oleic acid, stearic acid, palmitic acid, hexylphosphonic acid, n-octylphosphonic acid, tetradecylphosphonic acid, octadecylphosphonic acid, n-octyl amine and hexadecyl amine.

* * * * *